(12) United States Patent
Watanabe et al.

(10) Patent No.: US 8,118,531 B2
(45) Date of Patent: Feb. 21, 2012

(54) TRAY HOLDING DEVICE

(75) Inventors: Yoshito Watanabe, Tokyo (JP); Yoji Shinozaki, Tokyo (JP)

(73) Assignee: Hirata Corporation, Tokyo (JP)

( * ) Notice: Subject to any disclaimer, the term of this patent is extended or adjusted under 35 U.S.C. 154(b) by 945 days.

(21) Appl. No.: 12/084,686

(22) PCT Filed: Nov. 21, 2005

(86) PCT No.: PCT/JP2005/021748
§ 371 (c)(1),
(2), (4) Date: May 20, 2008

(87) PCT Pub. No.: WO2007/057980
PCT Pub. Date: May 24, 2007

(65) Prior Publication Data
US 2009/0169345 A1 Jul. 2, 2009

(51) Int. Cl.
*B65G 65/00* (2006.01)
(52) U.S. Cl. .................. 414/286; 269/254 CS
(58) Field of Classification Search .............. 414/795.3, 414/798, 798.2, 222.01, 267, 286; 156/584, 156/701; 269/134, 138, 254 CS
See application file for complete search history.

(56) References Cited

U.S. PATENT DOCUMENTS

| | | | | |
|---|---|---|---|---|
| 6,966,744 B1 * | 11/2005 | Cho | ............................ | 414/795.3 |
| 7,806,642 B2 * | 10/2010 | Narita et al. | ................ | 414/217.1 |
| 7,959,402 B2 * | 6/2011 | Hashinokuchi | ................ | 414/798 |
| 2004/0228719 A1 * | 11/2004 | Woodruff et al. | ........... | 414/744.5 |
| 2005/0180844 A1 * | 8/2005 | Uekert et al. | ................ | 414/788.1 |

FOREIGN PATENT DOCUMENTS

| | | | |
|---|---|---|---|
| JP | 61-21726 | | 2/1986 |
| JP | 02247651 A | * | 10/1990 |
| JP | 2-291198 | | 11/1990 |
| JP | 7-198779 | | 8/1995 |
| JP | 2000-356666 | | 12/2000 |
| JP | 2001-122439 | | 5/2001 |

OTHER PUBLICATIONS

International Search Report issued Dec. 20, 2005 in the International (PCT) Application of which the present application is the U.S. National Stage.

* cited by examiner

*Primary Examiner* — Joshua Rudawitz
(74) *Attorney, Agent, or Firm* — Wenderoth, Lind & Ponack, L.L.P.

(57) ABSTRACT

A tray holding device includes a frame (20) that defines a tray elevation area (A) in which a tray containing workpieces can be lifted and lowered and that allows the loading and unloading of workpieces from above, a lower supporting member (40) that is fixed to the frame to horizontally receive and support the tray in the tray elevation area (A), an elevation mechanism (60) that is provided at the frame to lift and lower the tray supported by the lower supporting member, and an upper supporting mechanism (50) that is mounted to the frame to receive and support the tray lifted by the elevation mechanism from below and to horizontally carry it out. Thus, the size, installation space, etc., of the tray holding device can be reduced, and the productivity can be heightened by shortening a waiting time.

9 Claims, 12 Drawing Sheets

TRAY HOLDING DEVICE

TECHNICAL FIELD

The present invention relates to a tray holding device that holds a tray containing workpieces of IC, LSI, or CPU semiconductor chips or workpieces of other electronic parts. More particularly, the present invention relates to a tray holding device that holds trays when unprocessed workpieces or processed workpieces are transferred from one tray to another tray so as to apply processing, such as testing or examination, onto the workpieces and that is capable of carrying out a tray containing unprocessed workpieces and carrying in a tray containing processed workpieces.

BACKGROUND ART

To apply various processing, such as testing or examination, onto workpieces, such as semiconductor chips, these workpieces are conveyed through a plurality of processing stages. To allow the workpieces to be efficiently conveyed and be efficiently subjected to such processing, use is made of a general-purpose tray (user tray) that can contain a plurality of workpieces at the same time and a special-purpose processing tray (test tray) that differs from the general-purpose tray in, for example, containing pitch and that has a lock mechanism that locks workpieces (see Japanese Unexamined Patent Publication No. H7-198779, for example).

In detail, each general-purpose tray that contains a plurality of workpieces arranged thereon is successively conveyed to follow various processing stages. In a predetermined transferring area, a plurality of unprocessed workpieces are taken out from the general-purpose tray in one lump, and are transferred to a processing tray. The processing tray that contains the unprocessed workpieces are then transported to a processing area (test area) in which unprocessed workpieces undergo a predetermined processing. The processing tray containing the workpieces that have undergone the predetermined processing in the processing area is again transported to the transferring area. The workpieces that have undergone the predetermined processing are again returned to the general-purpose tray, and are conveyed to follow the next processing stage.

In the transferring area in which workpieces are transferred, unprocessed workpieces and processed workpieces are transferred while a tray holding device is holding one processing tray. Therefore, the processing tray is required to wait without being transported to the processing area until these workpieces are completely transferred. As a result, the processing time becomes long as a whole, and there is a limit to the improvement of productivity.

Therefore, a possible method for solving these problems is to arrange a plurality of processing trays on a plane in the tray holding device, to provide a plurality of transporting devices that transport processing trays between the transferring area and the processing area, and to transport the processing trays at the same time. However, this method merely brings about an increase in size of the tray holding device, an increase in cost, and an increase in installation space that is required to install the device. Accordingly, this method makes it difficult to achieve a decrease in size of the device, consolidation, a decrease in cost, space-saving, etc.

The present invention has been made in consideration of these circumstances. It is, therefore, an object of the present invention to provide a tray holding device that is capable of achieving structural simplification, mechanical consolidation, size reduction in the entire device, space-saving in installation space, or shortening of a processing-time as a whole which is brought about by, for example, shortening a waiting time, that is capable of efficiently applying various processing, such as testing, examination, measurement, treatment, or assembling, onto workpieces, such as semiconductor chips, substrates, or other electronic parts, and that is capable of heightening productivity.

SUMMARY OF THE INVENTION

A tray holding device of the present invention that achieves the object mentioned above includes a frame that defines a tray elevation area in which a tray containing workpieces can be lifted and lowered and that allows the workpieces to be taken in and out from above, a lower supporting member fixed to the frame so as to receive the tray from a horizontal direction into the tray elevation area and support the tray, an elevation mechanism mounted to the frame so as to lift and lower the tray supported by the lower supporting member, and an upper supporting mechanism mounted to the frame so as to receive and support the tray lifted by the elevation mechanism from below and carry out the tray in the horizontal direction.

According to this structure, when a tray containing processed workpieces is carried in from the horizontal direction and is held by the lower supporting member, the tray passes through the upper supporting mechanism in the tray elevation area and is lifted in accordance with an upward movement of the elevation mechanism, and the transfer operation between processed workpieces and unprocessed workpieces is performed from the upper side of the frame. The tray that has newly contained unprocessed workpieces is supported by the upper supporting mechanism in accordance with a downward movement of the elevation mechanism. After that, the tray that has contained processed workpieces is carried in and is supported by the lower supporting member, and the tray supported by the upper supporting mechanism is carried out toward a processing area.

Thus, since workpieces are successively transported while the two trays are being held in the frame, the shortening of a processing time can be achieved as a whole by, for example, shortening a waiting time, and various processing, such as testing, examination, measurement, treatment, or assembling, can be efficiently applied onto workpieces, such as semiconductor chips, substrates, or other electronic parts, and hence productivity can be heightened. Additionally, since the lower supporting member and the upper supporting mechanism vertically arranged are mounted to the frame that defines a tray elevation area, the device can be reduced in size as a whole, and the space-saving of installation space can be achieved.

In the above-mentioned structure, the upper supporting mechanism can include a pair of swing supporting members capable of swinging to recede from the tray elevation area by being pushed by the tray lifted by the elevation mechanism from a supporting position at which the pair of swing supporting members project into the tray elevation area and support the tray, and an urging member that urges the swing supporting member toward the supporting position.

According to this structure, when the tray held by the lower supporting member is lifted by the elevation mechanism, a part of the tray pushes the swing supporting members upwardly to recede therefrom. Therefore, the tray is easily lifted upward beyond the upper supporting mechanism, and, when the tray passes therethrough, the swing supporting member is moved to the supporting position by the urging force of the urging member, and reaches in a state in which a tray can be supported thereby. Since the upper supporting mechanism is formed of the swing supporting member and the urging member in this way, the structure can be simplified, and the mechanisms can be consolidated, and hence the device can be reduced in size as a whole.

In the above-mentioned structure, the elevation mechanism can include a lead screw extended in a vertical direction, a motor that exerts a rotational driving force on the lead screw, a nut screwed to the lead screw, and a table that is lifted and lowered together with the nut and that is capable of supporting the tray.

According to this structure, the motor is started, the lead screw is then rotated, and the table is lifted together with the nut. Thus, a simple structure for converting a rotational movement around the vertical line into an upward-and-downward movement is employed as the elevation mechanism, and hence the table can be lifted and lowered in the tray elevation area, and the consolidation of components can make the device compact.

In the above-mentioned structure, the lower supporting member can have a regulating part that regulates a horizontal movement of the tray supported thereby.

According to this structure, when a tray containing processed workpieces is carried in from the horizontal direction onto the lower supporting member, a horizontal movement of the tray is regulated by the regulating part, and the tray is located at a predetermined position. Therefore, the tray can be smoothly lifted by the elevation mechanism.

In the above-mentioned structure, the swing supporting member can have a regulating part that regulates a horizontal movement of the tray supported thereby.

According to this structure, a tray that has newly contained unprocessed workpieces is moved together with a downward movement of the elevation mechanism, and is located at a predetermined position on the swing supporting member by the regulating part. Therefore, a tray can be smoothly carried out toward a predetermined processing area.

In the above-mentioned structure, the tray can have a lock mechanism that contains and locks the workpieces, and the frame can have a release mechanism that releases the lock mechanism of the tray that has been lifted and has passed through the upper supporting mechanism.

According to this structure, the tray containing processed workpieces is lifted by the elevation mechanism and, when the tray passes through the upper supporting mechanism and reaches a predetermined position, the release mechanism is actuated to release the lock mechanism, and hence the workpiece can be taken out. On the other hand, when a tray that has newly contained unprocessed workpieces is lowered by the elevation mechanism, and is supported by the upper supporting mechanism, the workpieces are locked by the lock mechanism at a predetermined position in a contained state.

Thus, since the tray can be smoothly held and carried in and out even in the structure provided with the lock mechanism and the release mechanism, the shortening of a processing time can be achieved as a whole, and various processing, such as testing, examination, measurement, treatment, or assembling, can be efficiently applied onto workpieces, such as semiconductor chips, substrates, or other electronic parts, and hence productivity can be heightened.

In the above-mentioned structure, the frame can be provided with detection sensors that detect the presence or absence of the tray supported by the lower supporting member and the presence or absence of the tray supported by the upper supporting mechanism.

According to this structure, since it is detected by the detection sensor whether the tray is supported by the lower supporting member and whether the tray is supported by the upper supporting mechanism, the tray carry-in operation and the tray carry-out operation can be controlled to be reliably and smoothly performed based on the respective detection signals.

In the above-mentioned structure, the frame can be supported to be movable in the horizontal direction perpendicular to a direction in which the tray comes in and out.

According to this structure, since the frame can be appropriately moved in the horizontal direction perpendicular to a direction in which the tray comes in and out, appropriate positioning of the frame can be performed with respect to a processing area into which a tray containing processed workpieces is carried and a processing area from which a tray loaded with unprocessed workpieces is carried out. Therefore, in the semiconductor production line provided with various processing areas, a tray can be smoothly transported as a whole, and productivity can be heightened.

DETAILED DESCRIPTION OF THE INVENTION

The most preferred embodiment of the present invention will be hereinafter described with reference to the accompanying drawings. In this embodiment, an IC or CPU semiconductor chip is used as a workpiece W, and a description will be given of a tray holding device that holds a tray T when workpieces W are transferred to the tray T used for processing in order to apply a predetermined examination processing onto the workpieces W. The tray T used in this embodiment has a lock mechanism T1 that locks the workpieces W which is contained in the tray T.

The lock mechanism T1 is made up of a gripping member that moves between a position where the gripping member comes into contact with and grips a terminal of a workpiece W and a position where the gripping member breaks off contact with and departs from the terminal, a spring that urges the gripping member to the terminal-gripping position, and a movable member that is formed to be movable in upward and downward directions so as to move the gripping member by being connected to the gripping member and by cam action and that allows the gripping member to depart from the terminal by the pressing force of a release mechanism 70 described later.

Figure 1:
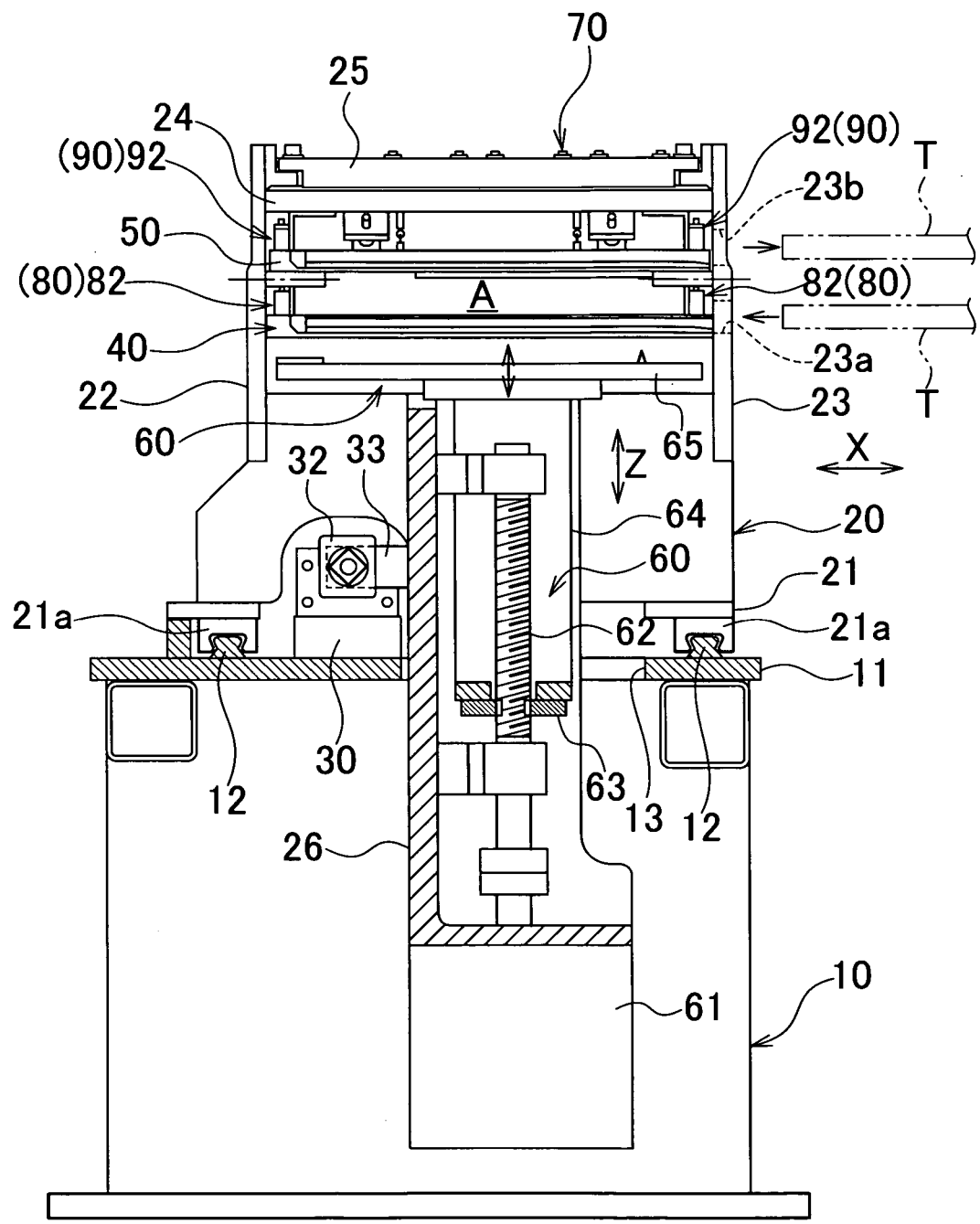
FIG. 1 is side view illustrating one embodiment of a tray holding device according to the present invention.
Figure 2:
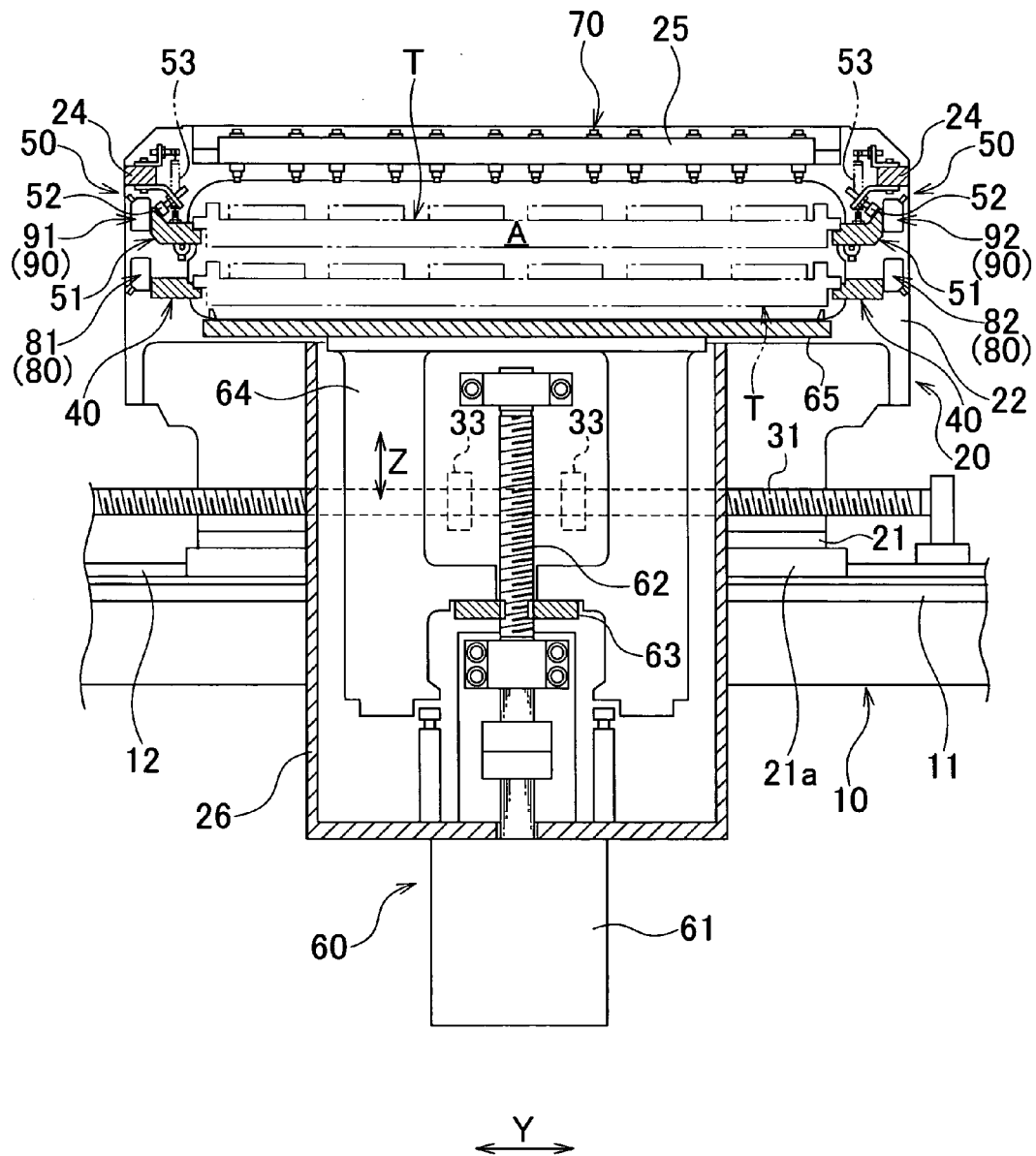
FIG. 2 is a sectional view illustrating a part of the tray holding device shown in FIG. 1.

As shown in FIG. 1 and FIG. 2, the tray holding device includes a base 10, a frame 20 supported to freely move in a horizontal direction (Y direction) with respect to the base 10, a drive mechanism 30 that drives the frame 20 in the horizontal direction (Y direction), a lower supporting member 40 fixed to the frame 20, an upper supporting mechanism 50 mounted to the frame 20, an elevation mechanism 60 that is provided on the frame 20 and that lifts and lowers a tray T, are lease mechanism 70 that is mounted to the frame 20 and that releases the lock mechanism T1 of a tray T, a detection sensor 80 that detects the presence or absence of a tray T supported by the lower supporting member 40, and a detection sensor 90 that detects the presence or absence of a tray T supported by the upper supporting mechanism 50.

As shown in FIG. 1 and FIG. 2, the base 10 is made up of an upper board 11, two guide rails 12 that are extended in the Y direction on the upper board 11, and a cutout 13 that allows the frame 20 to move.

As shown in FIG. 1 and FIG. 2, the frame 20 is made up of a lower frame 21, side frames 22 and 23, a connection frame 24 through which the side frames 22 and 23 are connected together, an upper frame 25, and an inner frame 26 that holds the elevation mechanism 60. Thus, the frame 20 defines a tray elevation area A in which a tray T can be lifted and lowered.

As shown in FIG. 1 and FIG. 2, the lower frame 21 has a to-be-guided part 21a that is slidably fitted to the guide rail 12 of the base 10.

As shown in FIG. 1, the side frames 22 and 23 are connected to the lower frame 21, and hold the lower supporting member 40, the upper supporting mechanism 50, the detection sensors 80 and 90, etc. The side frame 23 is provided with a carry-in entrance 23a and a carry-out exit 23b through which a tray T is carried in and out. Although this embodiment shows a case in which the carry-in entrance 23a and the carry-out exit 23b are formed to be separated from each other, the carry-in entrance and the carry-out exit may be formed integrally with each other to be one opening.

The connection frame 24 is extended in the X direction, and is disposed at both ends in the Y direction and is formed so as to connect the side frames 22 and 23 together.

Figure 3:
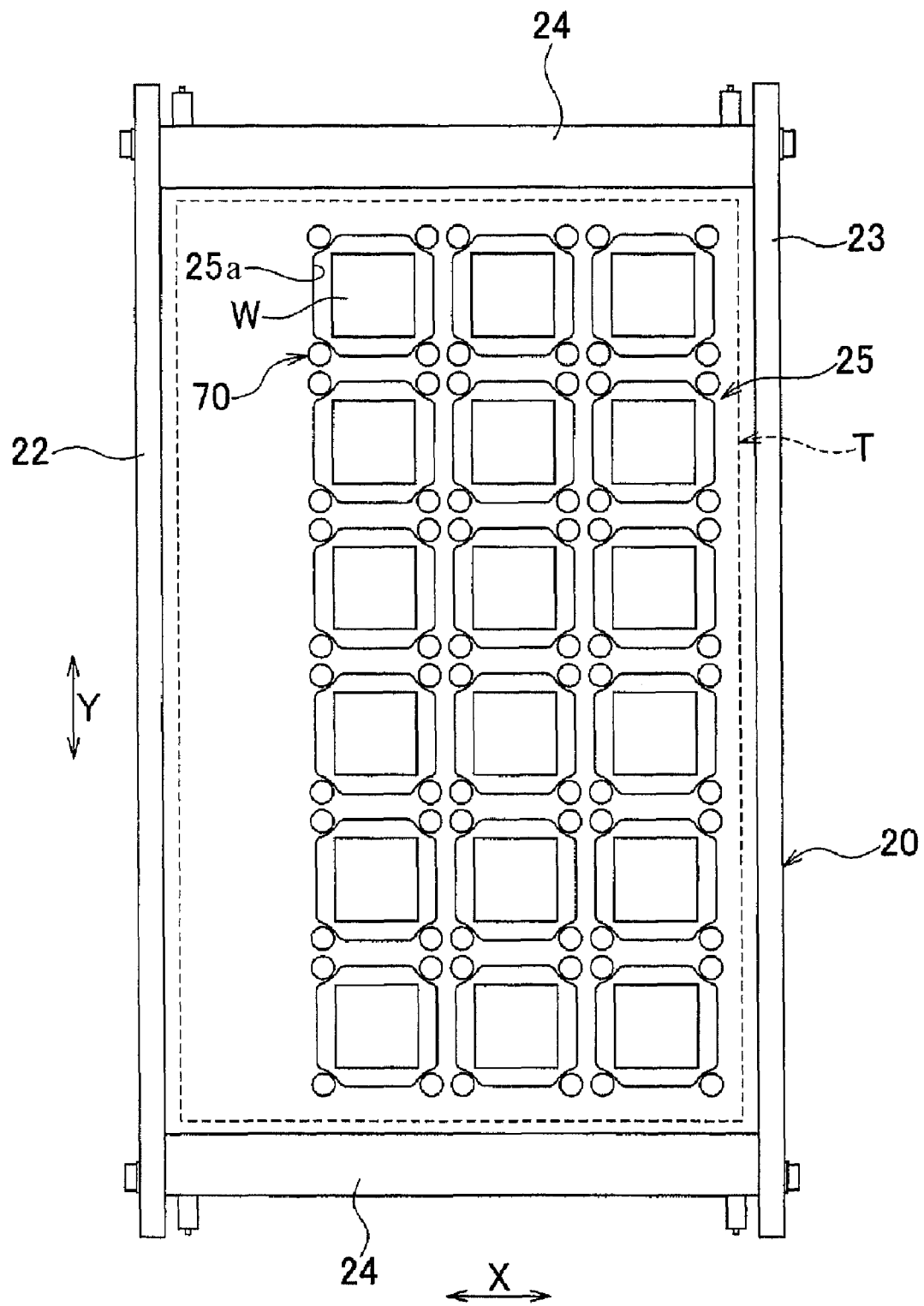
FIG. 3 is a plan view of the tray holding device shown in FIG. 1.

As shown in FIGS. 1 to 3, the upper frame 25 has a flattened shape, and is connected to upper ends of the side frames 22 and 23. The upper frame 25 has a plurality of openings 25a each of which has a substantially rectangular shape at a position corresponding to each workpiece W contained in a tray T. The upper frame 25 also has a plurality of release mechanisms 70 each of which is disposed around each opening 25a and corresponds to each workpiece W.

As shown in FIG. 1 and FIG. 2, the inner frame 26 holds a motor 61 and a lead screw 62, described later, of the elevation mechanism 60.

As shown in FIG. 2 and FIG. 3, the drive mechanism 30 is made up of a lead screw 31 that is extended in the Y direction and that is rotatably supported with respect to the upper board 11, a motor 32 fixed to the upper board 11 so as to exert a rotational driving force on the lead screw 31, and a nut 33 that is connected to the inner frame 26 and that is screwed to the lead screw 31. A stepping motor, a DC motor, and other motors can be used as the motor 32.

In more detail, when the lead screw 31 is rotated by starting the motor 32, the frame 20 (inner frame 26) is moved in the Y direction together with the nut 33, so that the carry-in entrance 23a and the carry-out exit 23b can be located at a position corresponding to a predetermined processing area.

As shown in FIGS. 1 to 4, the lower supporting members 40 are symmetrically disposed at both ends in the Y direction as a pair, both of which are fixed to the side frames 22 and 23, respectively. As shown in FIG. 5, the pair of lower supporting members 40 are made up of supporting surfaces 41 extended in the X direction, sidewalls 42 (i.e., first sidewalls of the lower supporting members 40) formed to face each other in the Y direction, sidewalls 43 (i.e., second sidewalls of the lower supporting members 40) formed on the deepest side in the X direction of the sidewall 42, and inclined parts 44 adjacent to the opening 23a in the X direction.

The supporting surface 41 is used to receive a tray T carried in from the horizontal direction (i.e., from the X direction) while being slid and to support this tray T.

The sidewalls 42 and 43 serve as a regulating part that regulates the horizontal movement of a tray T supported by the supporting surface 41 so as to locate the tray T at a predetermined position. Therefore, when a tray T containing with processed workpieces W is carried in from the horizontal direction (X direction) onto the lower supporting members 40 (supporting surface 41), the sidewalls (regulating part) 42 and 43 locate the tray T at a predetermined position (in the tray elevation area A).

The inclined part 44 is adjacent to the opening 23a, and can smoothly guide a tray T, which is to be carried in, to the supporting surface 41.

Figure 4:
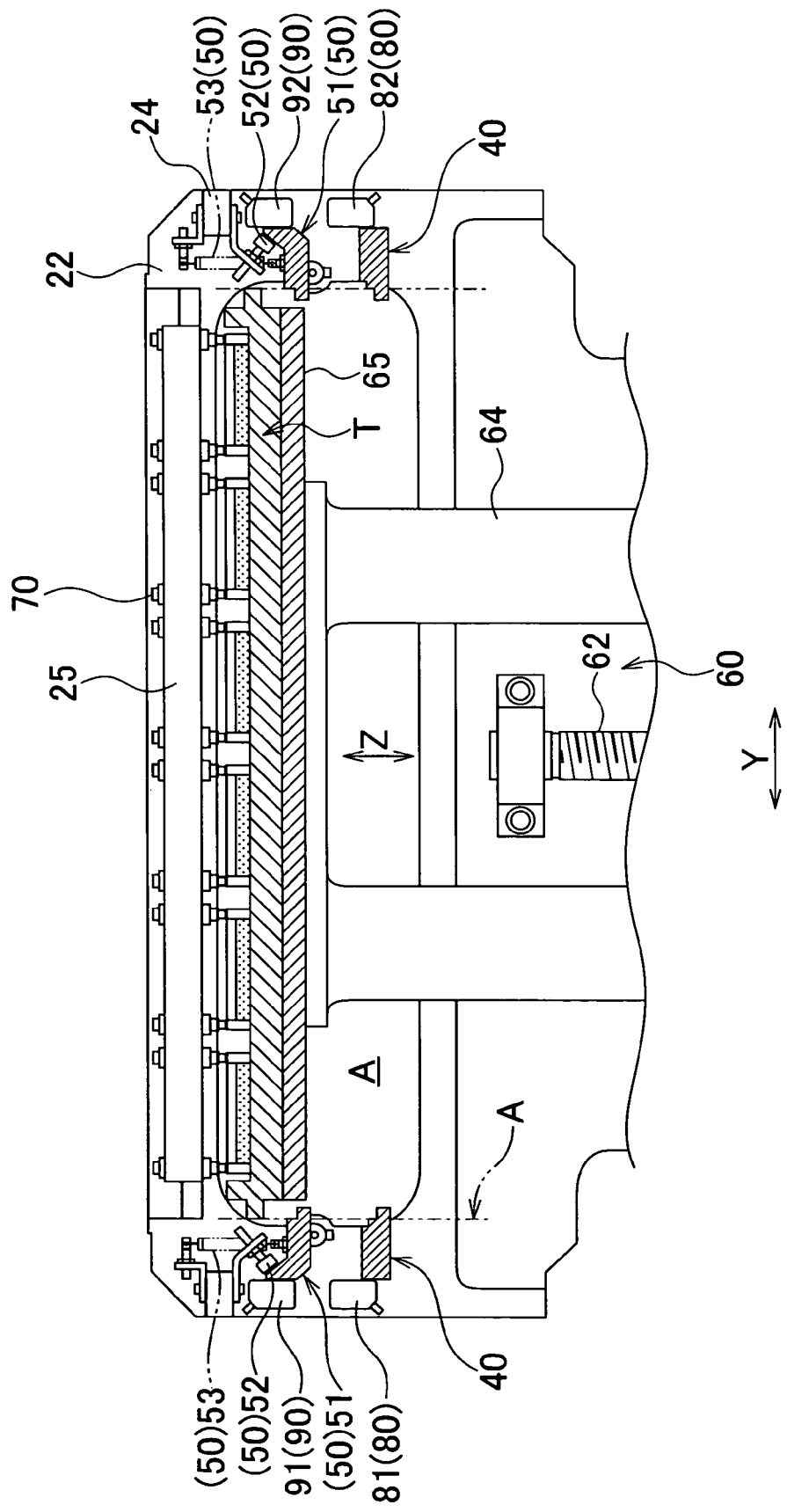
FIG. 4 is a partially enlarged sectional view illustrating a part of the tray holding device shown in FIG. 1.
Figure 5:
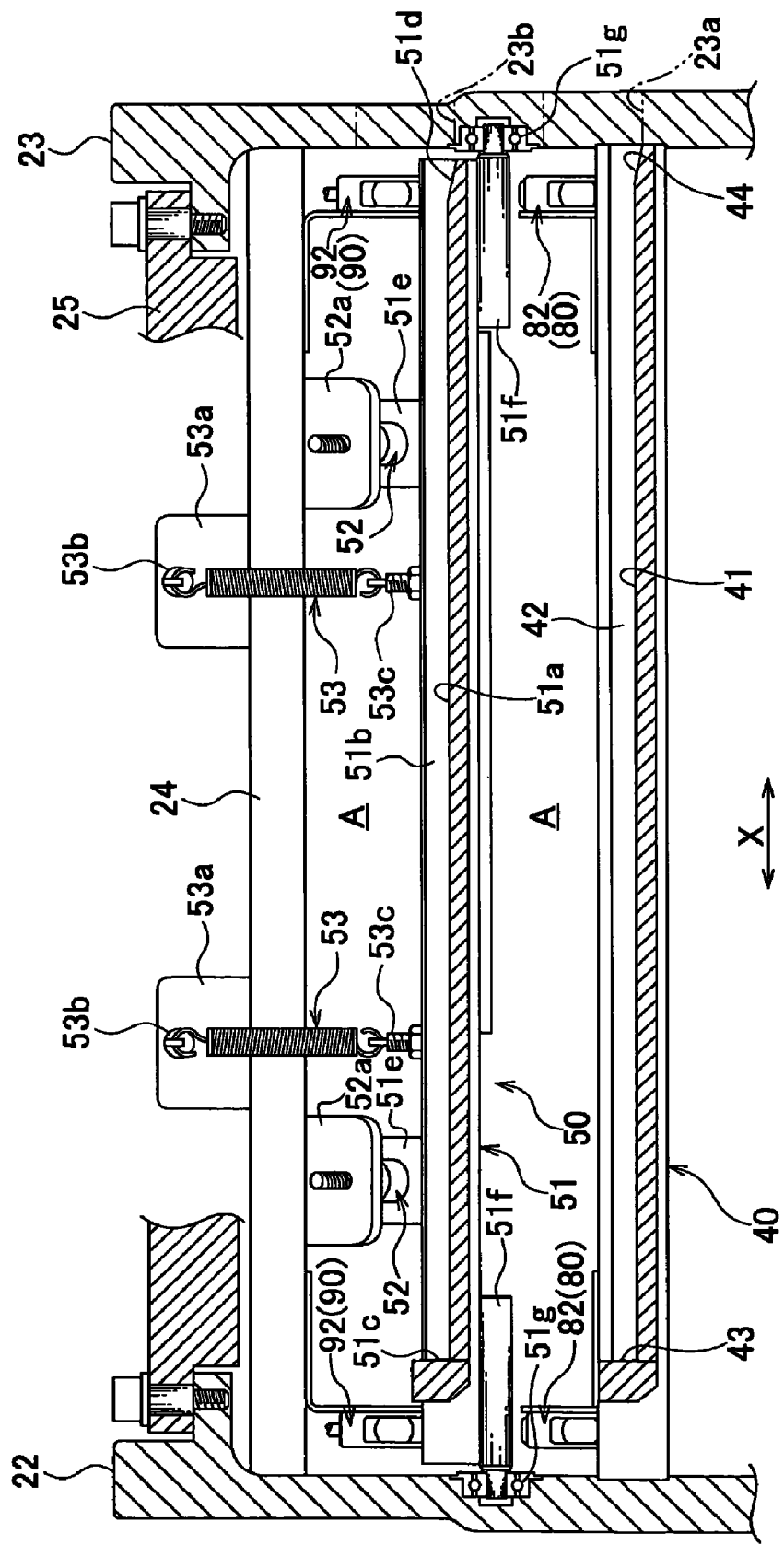
FIG. 5 is a partially enlarged sectional view illustrating a part of the tray holding device shown in FIG. 1.

As shown in FIG. 2, FIG. 4, and FIG. 5, the upper supporting mechanism 50 is made up of a pair of swing supporting members 51, stoppers 52 that locate the swing supporting member 51 at a supporting position respectively, and a coil spring 53 serving as an urging member that urges the swing supporting member 51 toward the supporting position.

As shown in FIG. 5, the pair of swing supporting members 51 are made up of supporting surfaces 51a extended in the X direction, sidewalls 51b (i.e., first sidewalls of the swing supporting members 51) formed to face each other in the Y direction, sidewalls 51c (i.e., second sidewalls of the swing supporting members 51) formed on the deepest side in the X direction of the sidewall 51b, inclined parts 51d adjacent to the opening 23b in the X direction, and contact parts 51e being in contact with the stoppers 52 respectively.

The supporting surface 51a is used to horizontally support a tray T containing unprocessed workpieces W.

The sidewalls 51b and 51c serve as a regulating part that regulates the horizontal movement of a tray T supported by the supporting surface 51a so as to locate the tray T at a predetermined position. Therefore, the tray T containing unprocessed workpieces W is prevented from being horizontally displaced after being released from the elevation mechanism 60, and is located at a predetermined position.

The inclined part 51d is adjacent to the opening 23b, and can smoothly guide the tray T so as to carry the tray T out from the supporting surface 51a.

As shown in FIG. 5, a shaft 51f that is joined with the underface of the swing supporting member 51 and that is extended in the X direction is supported by bearings 51g of the sidewalls 22 and 23, and hence the pair of swing supporting members 51 are swingable.

As shown in FIG. 2 and FIGS. 4 to 8, the stopper 52 is held by means of a bracket 52a fixed to the frame 20 (connection frame 24), and can adjust the contact position of the contact part 51e by use of a screw. In other words, the stopper 52 locates the swing supporting member 51 at a supporting position by bringing the contact part 51e into contact therewith and regulating its movement.

As shown in FIG. 2 and FIGS. 4 to 8, the coil spring 53 is stretched between a retainer screw 53b screwed to the bracket 53a fixed to the frame 20 (connection frame 24) and a retainer screw 53c screwed to the swing supporting member 51. The coil spring 53 exerts an urging force that urges the swing supporting member 51 toward the supporting position.

Figure 6:
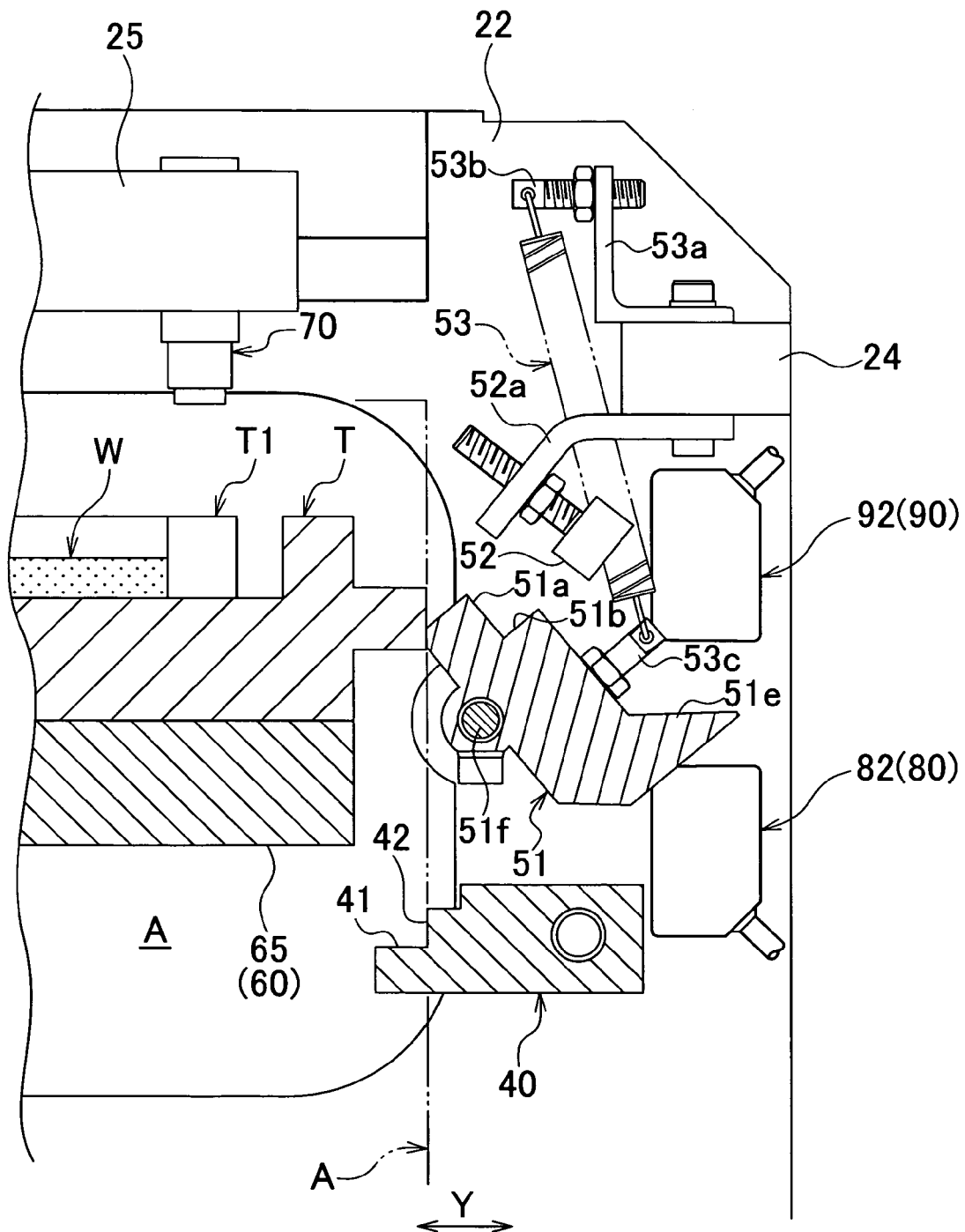
FIG. 6 is a partially enlarged sectional view illustrating a part of the tray holding device shown in FIG. 1.

The operation of the upper supporting mechanism 50 will be described. First, a tray T supported by the lower supporting member 40 is lifted by the elevation mechanism 60, and, as shown in FIG. 6, a part of the tray T comes into contact with the swing supporting member 51 located at a supporting position, and pushes the swing supporting member 51 up. Therefore, the swing supporting member 51 moves to a position receding from the tray elevation area A while resisting the urging force of the coil spring 53, and allows the passage of the tray T.

Figure 7:
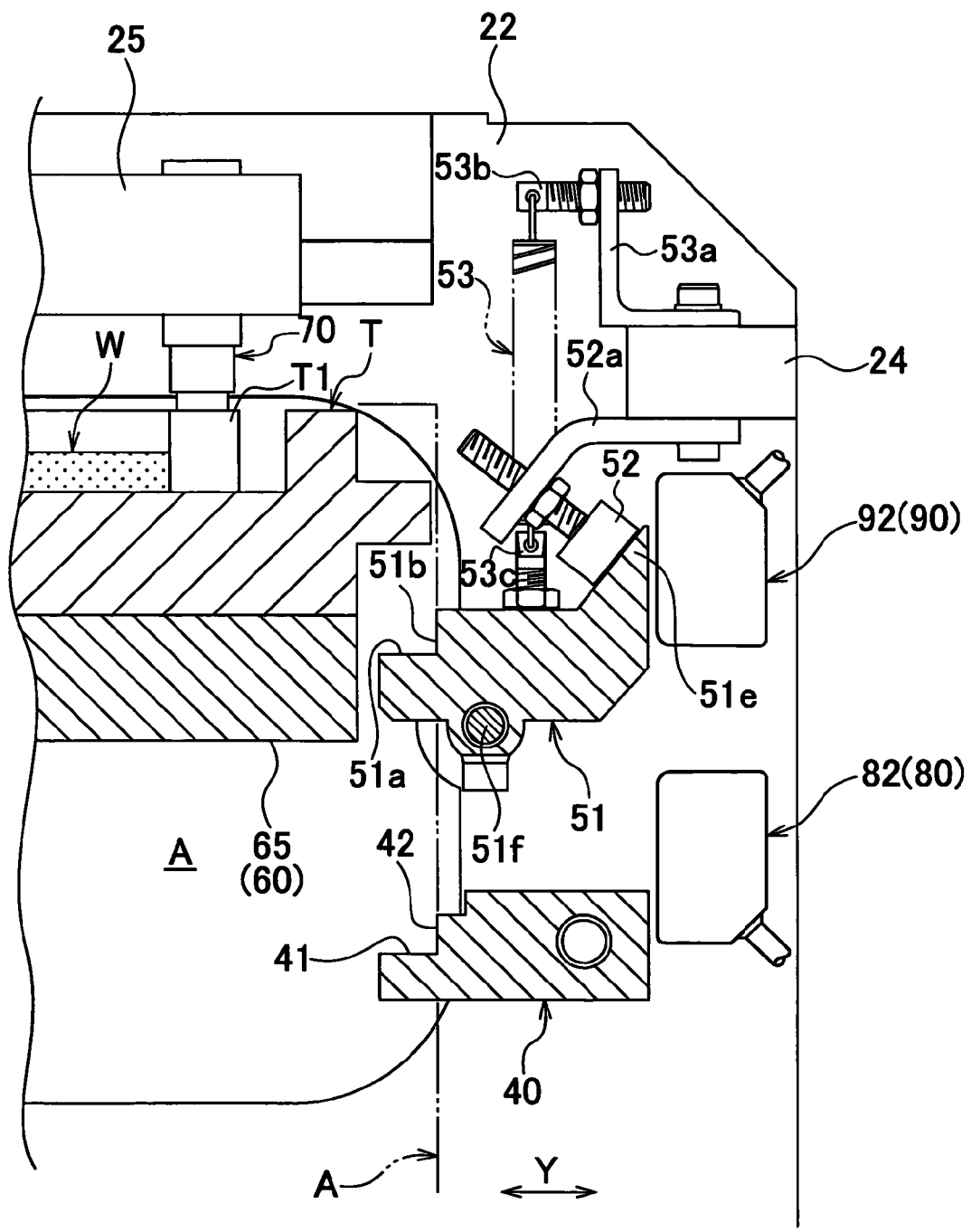
FIG. 7 is a partially enlarged sectional view illustrating a part of the tray holding device shown in FIG. 1.
Figure 8:
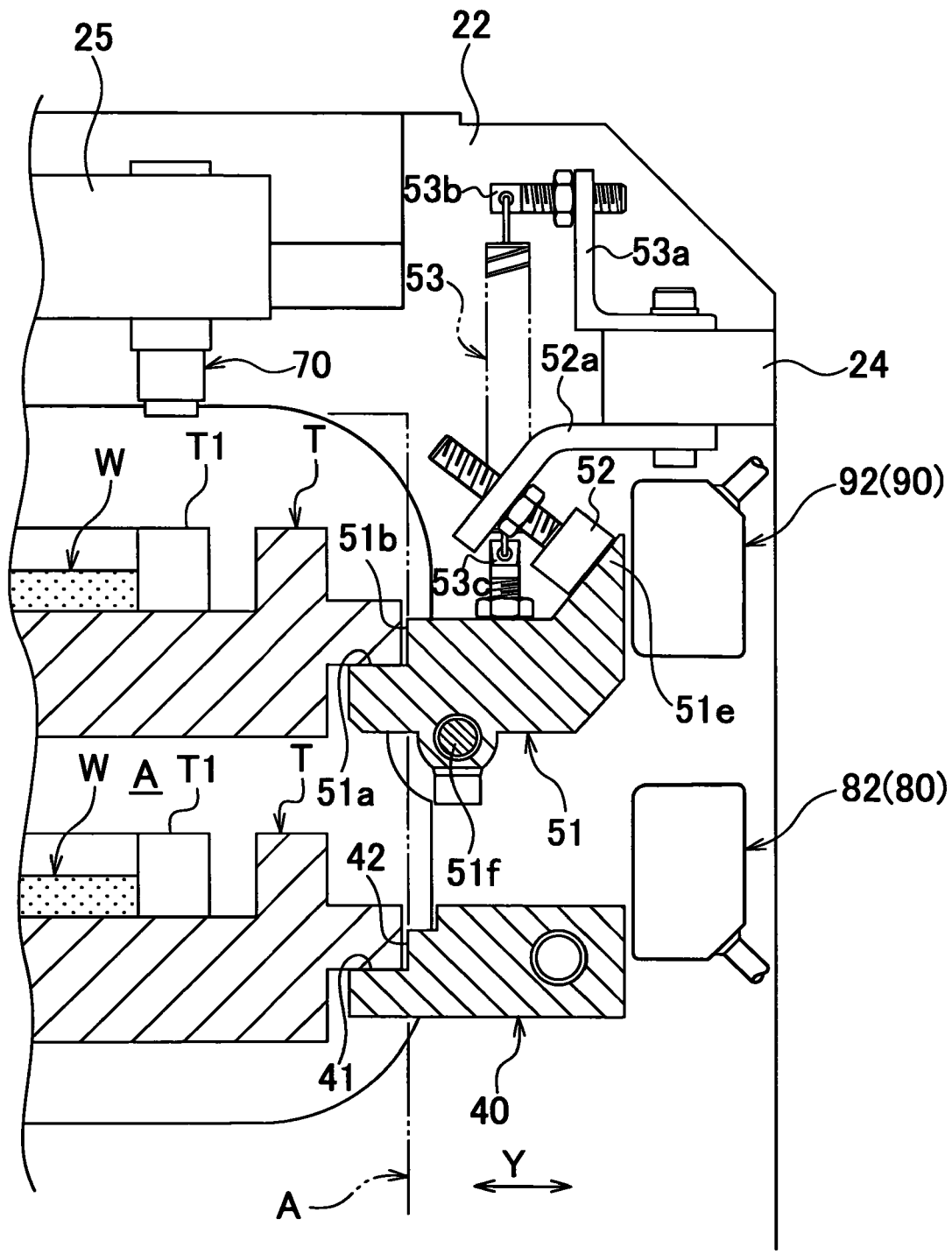
FIG. 8 is a partially enlarged sectional view illustrating a part of the tray holding device shown in FIG. 1.

Thereafter, the tray T is separated from the swing supporting member 51, and, as shown in FIG. 7, the swing supporting member 51 is projected into the tray elevation area A by the urging force of the coil spring 53, and is located at the supporting position, at which the tray T can be supported, when the contact part 51e comes into contact with the stopper 52.

Thereafter, when the elevation mechanism 60 is lowered and separated from the tray T, the tray T is supported by the swing supporting member 51 (supporting surface 51a), and the sidewalls (regulating part) 51b and 51c locate the tray T at a predetermined position.

In other words, in the upper supporting mechanism 50, the pair of swing supporting members 51 are supported swingably between the receding position at which they recede from the tray elevation area A as shown in FIG. 6 and the supporting position at which they are projected into the tray elevation area A and support the tray T as shown in FIG. 7, and hence the tray T supported by the lower supporting member 40 can be received and supported from below, and can be carried out in the horizontal direction (X direction).

As shown in FIG. 1 and FIG. 2, the elevation mechanism 60 is made up of a motor 61 fixed to the inner frame 26, a lead screw 62 that is disposed to be connected directly to the motor 61 and be extended in the upward-and-downward direction Z and that is rotatably supported by the inner frame 26, a nut 63 screwed to the lead screw 62, an elevation base 64 connected to the nut 63, and a table 65 disposed at an upper end of the elevation base 64. A stepping motor, a DC motor, and other motors can be used as the motor 61.

When the motor 61 is started, and the lead screw 62 is rotated, the nut 63 is moved up and down, and the table 65 is lifted and lowered by means of the elevation base 64 connected to the nut 63.

In this embodiment, the table 65 of the elevation mechanism 60 is lifted and lowered between a waiting position placed lower than a tray T supported by the lower supporting member 40 as shown in FIG. 2 and an upper end position at which the release mechanism 70 releases a lock state by being engaged with the lock mechanism T1 of the tray T as shown in FIG. 7, and, accordingly, the tray T can be lifted and lowered in the range of the tray elevation area A.

Thus, a simple structure for converting a rotational movement around the vertical line into an upward-and-downward movement is employed as the elevation mechanism, and hence the table 65 can be lifted and lowered in the tray elevation area A, and the consolidation of components can make the device compact.

As shown in FIG. 3, FIG. 4, and FIGS. 6 to 8, the release mechanism 70 is held by the upper frame 25, and includes a rod protruding downwardly and a spring that urges the rod downwardly with a greater urging force than the spring of the lock mechanism T1.

In more detail, in the release mechanism 70, a tray T is lifted by the elevation mechanism 60 as shown in FIG. 7, and a lower end part of the release mechanism 70 (i.e., the rod of the release mechanism 70) comes into contact with the lock mechanism T1 (i.e., the movable member of the lock mechanism T1), and exerts a downward urging force thereon, and, as a result, the lock mechanism T1 is released, so that workpieces W can be taken out.

The detection sensor 80 is made up of a light emitting element 81 that is disposed outside one of the lower supporting members 40 and that emits detection light and a light receiving element 82 that is disposed outside the other lower supporting member 40 and that receives detection light. As shown in FIG. 1 and FIG. 5, the detection sensor 80 is disposed at two points near both ends in the extending direction (i.e., the X direction) of the lower supporting member 40.

In detail, when a tray T begins to be carried onto the lower supporting member 40, one of the detection sensors 80 emits a detection signal, and the other detection sensor 80 also emits a detection signal in a state in which the tray T is completely carried in, so that it is detected that the tray T is reliably placed on the lower supporting member 40 (i.e., the presence of the tray T is detected). On the other hand, if no detection signal is emitted from both detection sensors 80, it is detected that the tray T is not placed on the lower supporting member 40 (i.e., the absence of the tray T is detected).

Therefore, it is detected by the detection sensors 80 whether the tray T is placed on the lower supporting member 40, and hence the carry-in operation of the tray T can be controlled to be performed reliably and smoothly.

The detection sensor 90 is made up of a light emitting element 91 that is disposed outside one of the swing supporting members 51 and that emits detection light and a light receiving element 92 that is disposed outside the other swing supporting member 51 and that receives detection light. As shown in FIG. 1 and FIG. 5, the detection sensor 90 is disposed at two points near both ends in the extending direction (X direction) of the swing supporting member 51.

In detail, both of the detection sensors 90 respectively emit detection signals, whereby it is detected that a tray T is reliably placed on the swing supporting member 51 (i.e., the presence of a tray T is detected). When the tray T begins to be carried out, only one of the detection sensors 80 emits a detection signal, and a detection signal is not emitted from both of the detection sensors 90, and, as a result, it is detected that the tray T has been completely carried out and is not placed on the swing supporting member 51 (i.e., the absence of the tray T is detected).

Therefore, it is detected by the detection sensors 90 whether the tray T is placed on the swing supporting member 51 of the upper supporting mechanism 50, and hence the carry-out operation of the tray T can be controlled to be performed reliably and smoothly.

Next, the operation of the tray holding device will be described with reference to FIGS. 9A to 12B.

Figure 9A:
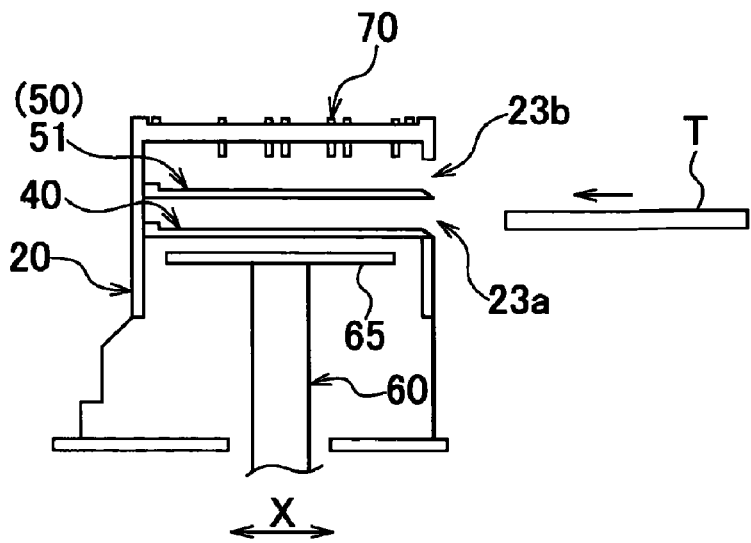
FIG. 9A, FIG. 9B, and FIG. 9C are operational views for explaining the operation of the tray holding device shown in FIG. 1.

First, in a state in which the elevation mechanism 60 is located at the waiting position, the tray T containing processed workpieces W that have undergone predetermined processing is transported to the lower supporting member 40 by means of a transporting device (not shown) or the like, as shown in FIG. 9A.

Figure 9B:
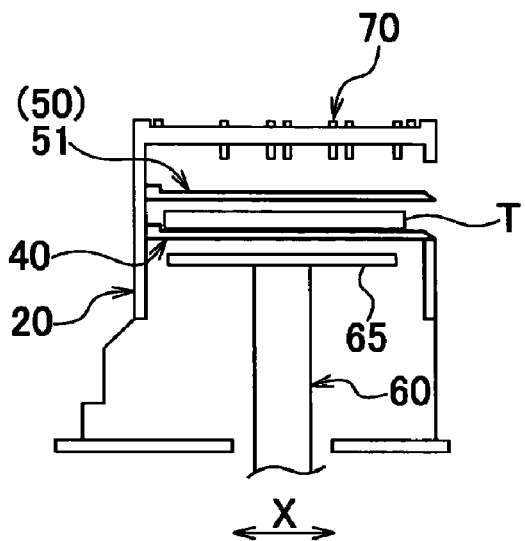
Figure 9C:
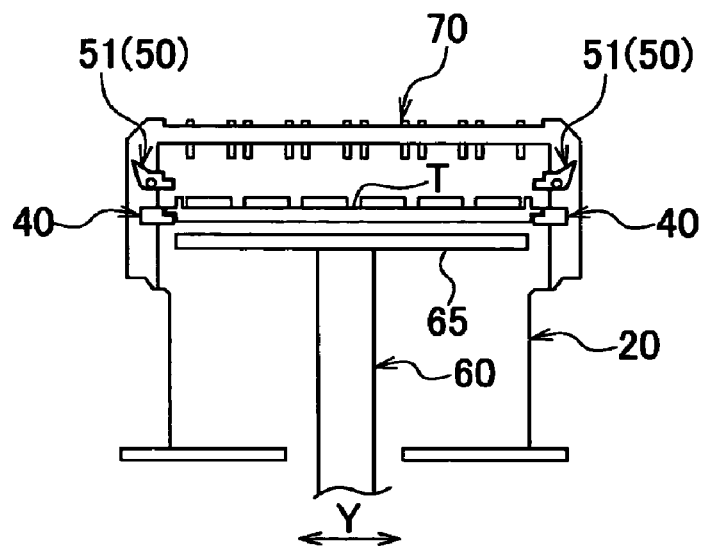

Thereafter, as shown in FIG. 9B and FIG. 9C, the tray T is guided from the opening 23a onto the lower supporting member 40 (i.e., supporting surface 41), and is supported thereby.

At this time, the sidewalls 42 and 43 serve to locate the tray T at a predetermined position in the horizontal direction.

Figure 10A:
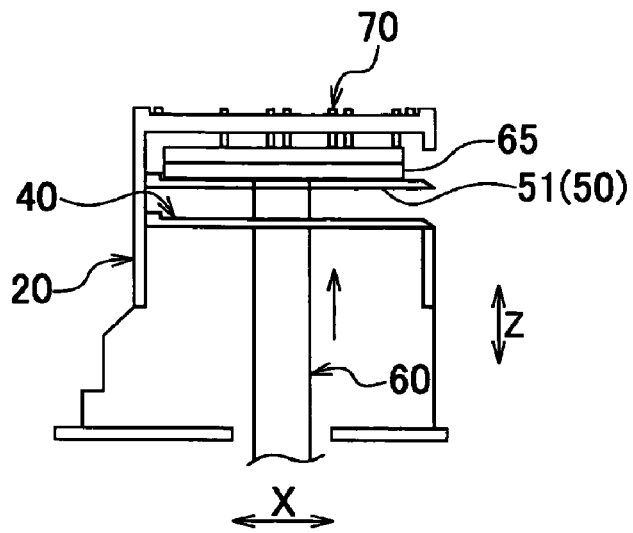
FIG. 10A, FIG. 10B, and FIG. 10C are operational views for explaining the operation of the tray holding device shown in FIG. 1.
Figure 10B:
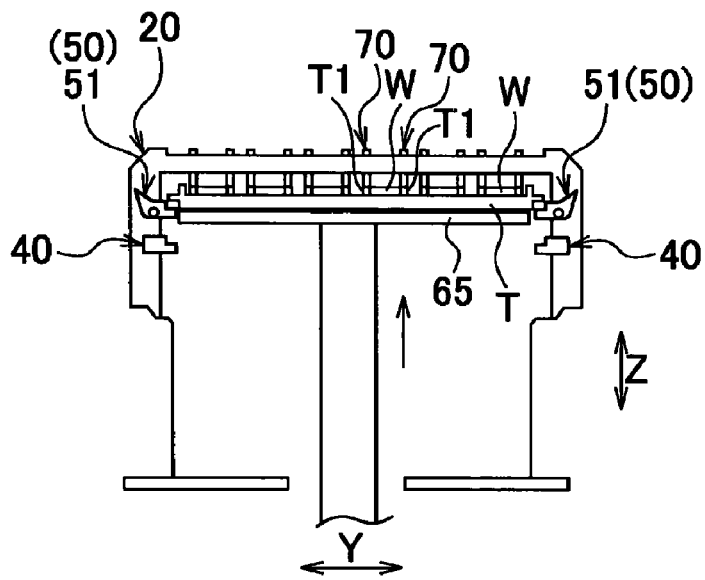

Thereafter, as shown in FIG. 10A and FIG. 10B, the elevation mechanism 60 is actuated, and the table 65 is lifted. Accordingly, the tray T placed on the lower supporting member 40 is supported by the table 65, and is allowed to pass through the swing supporting member 51 and be lifted higher.

In detail, when the tray T placed on the table 65 is lifted as shown in FIG. 6, a part of the tray T is brought into contact with the swing supporting member 51 located at the supporting position, and pushes the swing supporting member 51 upwardly. The swing supporting member 51 is moved to a position receding from the tray elevation area A while resisting the urging force of the coil spring 53, and the tray T is allowed to pass therethrough.

Thereafter, when the tray T is separated from the swing supporting member 51, the swing supporting member 51 is projected into the tray elevation area A by the urging force of the coil spring 53 as shown in FIG. 7, and returns to the supporting position at which a tray T can be supported.

When the state shown in FIG. 10B is reached, the release mechanism 70 is actuated, and the lock state of the lock mechanism T1 is released. In this state, the transfer between processed workpieces W and unprocessed workpieces W is performed by a workpiece transferring device (not shown).

Figure 10C:
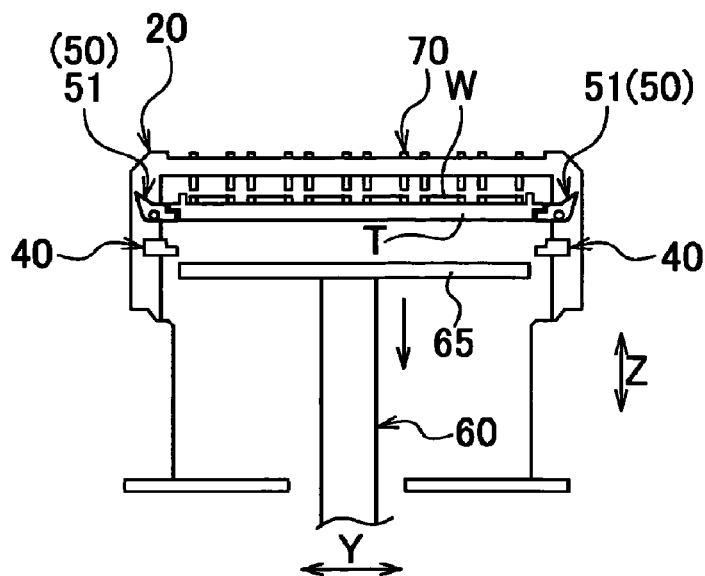

When the workpiece transfer is completed, the elevation mechanism 60 is actuated, and the table 65 begins to be lowered. Accordingly, the tray T containing unprocessed workpieces W is supported by the swing supporting member 51 (i.e., supporting surface 51a thereof) as shown in FIG. 10C, and is located at the predetermined position by means of the sidewalls 51b and 51c. On the other hand, the table 65 is lowered downwardly beyond the lower supporting member 40, and is stopped at the waiting position.

Figure 11A:
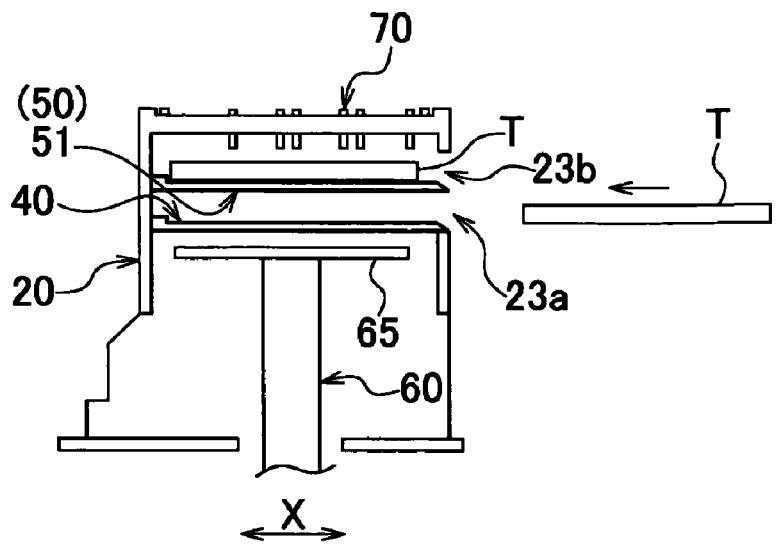
FIG. 11A, FIG. 11B, and FIG. 11C are operational views for explaining the operation of the tray holding device shown in FIG. 1.

Thereafter, the tray T containing processed workpieces W that have undergone predetermined processing is transported to the lower supporting member 40 by means of a transporting device (not shown) or the like, as shown in FIG. 11A.

Figure 11B:
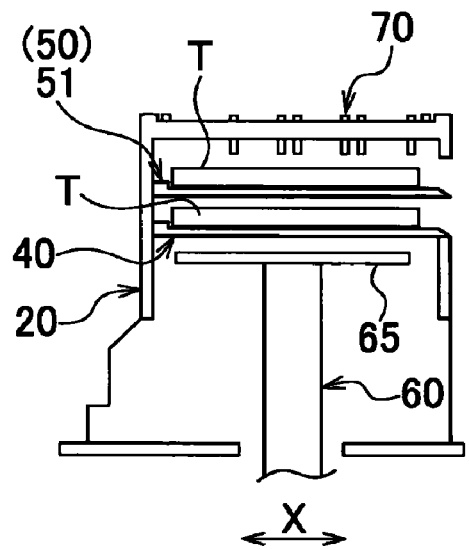
Figure 11C:
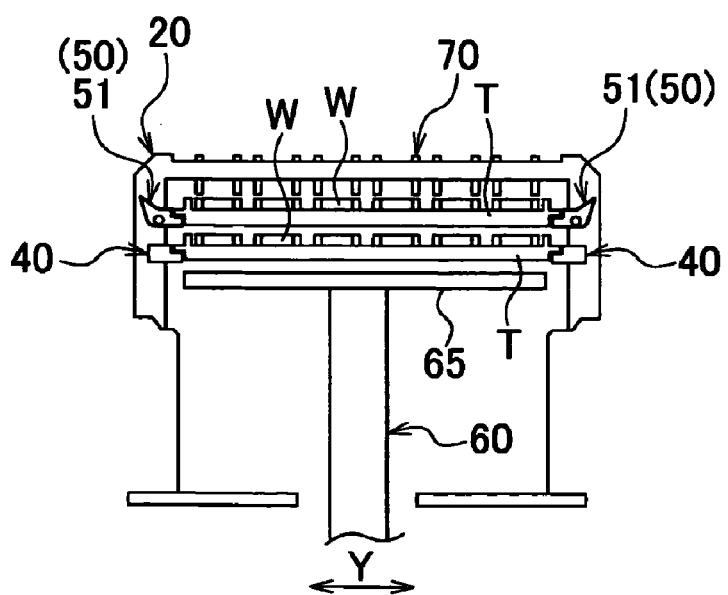

Thereafter, as shown in FIG. 11B and FIG. 11C, the tray T is guided from the opening 23a onto the lower supporting member 40 (supporting surface 41), and is supported thereby. At this time, the sidewalls 42 and 43 serve to locate the tray T at a predetermined position in the horizontal direction.

In this state, trays T are arranged in the upward-and-downward direction Z. In other words, in this device, two trays T are arranged not in the horizontal direction but in the upward-and-downward direction (i.e., vertical direction) Z with respect to the frame 20 by which the tray elevation area A is defined. Therefore, the device can be reduced in size as a whole, and the space-saving of the installation space can be achieved.

Figure 12A:
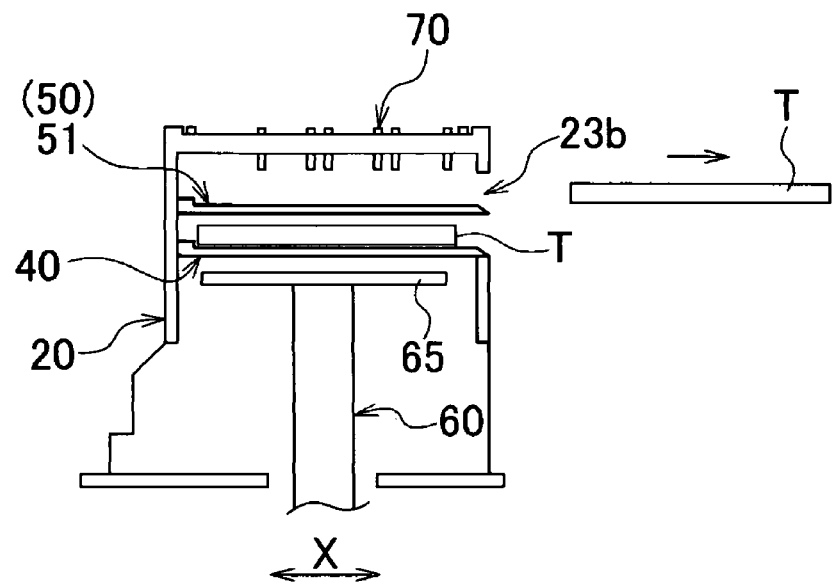
FIG. 12A and FIG. 12B are operational views for explaining the operation of the tray holding device shown in FIG. 1.
Figure 12B:
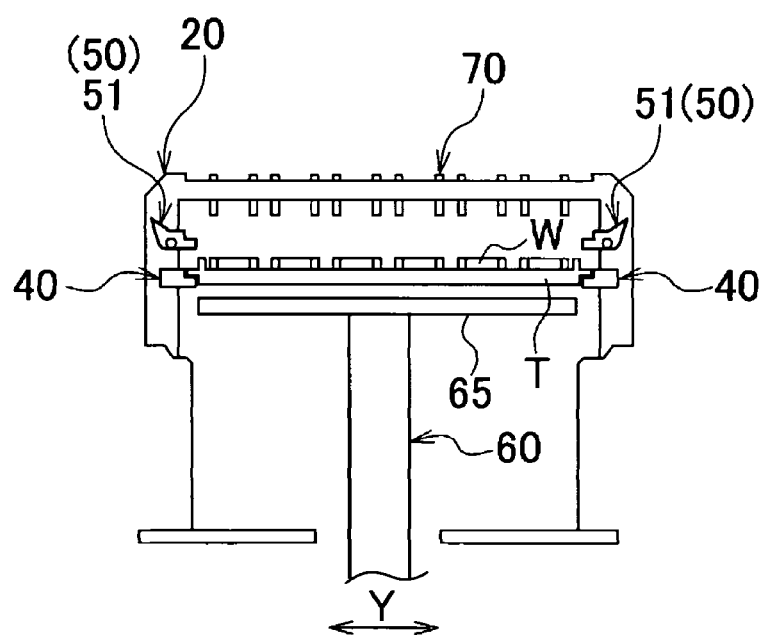

Thereafter, a tray T containing unprocessed workpieces W is carried out from the swing supporting member 51 in the horizontal direction (X direction) by means of a transporting device (not shown) or the like, as shown in FIG. 12A and FIG. 12B, and is transported to a predetermined processing area.

Thereafter, the operations shown in FIGS. 10A to 12B are repeatedly performed.

Thus, two trays T can be successively transported while being held in the frame 20, and hence a processing time can be shortened as a whole by shortening a waiting time, and workpieces, such as semiconductor chips, can be efficiently subjected to various processing, such as examination or measurement. Therefore, productivity can be heightened.

Additionally, since two trays T are held in the frame 20, a single transporting device (not shown) enables the tray transportation, and hence the transporting device can be prevented from being complicated and being enlarged. As a result, installation cost can be reduced, and unnecessary operations are eliminated. Therefore, processing efficiency can be improved as a whole, and productivity can be heightened.

In this embodiment, a case has been described in which the frame 20 is stopped at a position corresponding to a predetermined processing area, and then a tray T is transported. If a tray T is transported in the same way in different processing areas, or if a processing area into which a tray T containing processed workpieces W is carried differs from a processing area from which a tray T containing unprocessed workpieces W is carried out, the drive mechanism 30 is actuated, and the frame 20 can be appropriately moved to a predetermined position in the Y direction corresponding to a desired processing area.

In other words, a tray T can be smoothly transported as a whole by allowing the frame 20 to properly move in the horizontal direction (i.e., the Y direction) perpendicular to a direction in which a tray T is carried in and out (i.e., perpendicular to the X direction). Therefore, productivity can be heightened.

In this embodiment, the pair of lower supporting members 40 are used as the lower supporting member. However, the present invention is not limited to this. If the lower supporting member can support a tray T and allow the passage of the elevation mechanism 60 (i.e., the table 65 thereof), it is permissible to employ an angular U-shaped structure having an opening on the carry-in side and being horizontally disposed or employ a square frame structure being horizontally disposed.

In this embodiment, the upper supporting mechanism is made up of the pair of swing supporting members 51, the stopper 52, the coil spring 53, etc. However, the present invention is not limited to this. If the upper supporting mechanism can receive a tray T from below and support this tray T, it is permissible to employ a supporting member that comes into or out from the tray elevation area A while rotating or swinging in a horizontal plane, or employ a supporting member that can support a tray T by allowing the tray T to pass through from below while rotating only in one direction and by restricting the rotation in the opposite direction when the tray T is lowered and brought into contact therewith, or employ a supporting member having a slide mechanism that comes into or out of the tray elevation area A while linearly reciprocating in the horizontal direction, or employ other mechanisms.

In this embodiment, a case has been described in which a tray T has the lock mechanism T1. However, the present invention is not limited to this. Even if a tray is used only to contain workpieces W, this is a tray to be used in the tray holding device of the present invention.

As described above, according to the tray holding device of the present invention, it is possible to achieve the structural simplification, the mechanical consolidation, the size reduction in the entire device, the space-saving in installation space, and the shortening of a processing time as a whole by, for example, shortening a waiting time, and it is possible to efficiently apply various processing, such as testing, examination, measurement, treatment, or assembling, onto workpieces, such as semiconductor chips, substrates, or other electronic parts, and hence productivity can be heightened.

INDUSTRIAL APPLICABILITY

As described above, in industrial fields in which workpieces are taken in or out while a tray is being held and in which the tray is transported to subject the workpieces to various processing, the tray holding device of the present invention is useful, of course, in the semiconductor production field, and is useful even in a production line of vehicles or vehicle parts, a production line of electronic apparatuses or electronic apparatus parts, and a field related to other machines or electronic parts.

The invention claimed is:

1. A tray holding device comprising:
   a frame that defines a tray elevation area in which a tray containing workpieces can be lifted and lowered, the frame having an opening for allowing the workpieces to be taken in and out of the tray from above;
   a lower supporting member fixed to the frame so as to receive the tray carried into the tray elevation area in a first horizontal direction and support the tray;
   an elevation mechanism mounted to the frame so as to lift and lower the tray supported by the lower supporting member; and
   an upper supporting mechanism mounted to the frame so as to receive and support the tray lifted by the elevation mechanism from below and carry out the tray in a second horizontal direction, the second horizontal direction being opposite to the first horizontal direction,
   wherein the tray includes a lock mechanism for locking the workpiece contained therein, and the frame includes a release mechanism provided in a vicinity of the opening for releasing a lock state of the workpiece by the lock mechanism.

2. The tray holding device according to claim 1, wherein the upper supporting mechanism includes
   a pair of swing supporting members capable of swinging to recede from the tray elevation area by being pushed by the tray lifted by the elevation mechanism from a supporting position at which the pair of swing supporting members project into the tray elevation area and support the tray, and
   a pair of urging members that respectively urge the swing supporting members toward the supporting position.

3. The tray holding device according to claim 1, wherein the elevation mechanism includes
   a lead screw extended in a vertical direction,
   a motor that exerts a rotational driving force on the lead screw,
   a nut screwed to the lead screw, and
   a table that is lifted and lowered together with the nut and that supports the tray.

4. The tray holding device according to claim 1, wherein the lower supporting member has a first sidewall arranged so as to restrict movement of the tray supported thereby in a third horizontal direction, the third horizontal direction being perpendicular to the first horizontal direction, and a second sidewall arranged so as to restrict movement of the tray supported thereby in the first horizontal direction, the second sidewall being provided on an opposite side of the tray elevation area from a side at which the tray is carried into the tray elevation area.

5. The tray holding device according to claim 2, wherein each swing supporting member has a first side wall arranged so as to restrict movement of the tray supported thereby in a third horizontal direction, the third horizontal direction being perpendicular to the first horizontal direction, and a second sidewall arranged so as to restrict movement of the tray supported thereby in the first horizontal direction.

6. The tray holding device according to claim 1, wherein the frame defines the tray elevation area inside thereof and has a carry-in entrance for allowing carrying-in of the tray in the first horizontal direction, and a carry-out exit for allowing carrying-out of the tray in the second horizontal direction,
   wherein the lower supporting member is provided inside of the frame so as to correspond to the carry-in entrance,
   wherein the elevation mechanism is provided on and inside of the frame and below the lower supporting member,
   and wherein the upper supporting mechanism is provided inside of the frame and above the lower supporting member so as to correspond to the carry-out exit.

7. The tray holding device according to claim 1, wherein the frame is provided with detection sensors that detect a presence or absence of the tray supported by the lower supporting member and a presence or absence of the tray supported by the upper supporting mechanism.

8. The tray holding device according to claim 1, further comprising:
   a base that supports the frame so as to be movable in a third horizontal direction, the third horizontal direction being perpendicular to the first and second horizontal directions; and
   a drive mechanism for driving the frame in the third horizontal direction.

9. The tray holding device according to claim 1, wherein the tray elevation area is defined so as to be only within the frame.

* * * * *